United States Patent [19]

Pathak et al.

[11] Patent Number: 4,879,481
[45] Date of Patent: Nov. 7, 1989

[54] DUAL I/O MACROCELL FOR HIGH SPEED SYNCHRONOUS STATE MACHINE

[75] Inventors: Jagdish Pathak, Los Altos Hills; Stephen M. Douglass, Santa Clara; Dov-Ami Vider, Sunnyvale, all of Calif.

[73] Assignee: Cypress Semiconductor Corporation, San Jose, Calif.

[21] Appl. No.: 241,015

[22] Filed: Sep. 2, 1988

[51] Int. Cl.⁴ ........................................ H03K 19/177
[52] U.S. Cl. ................................. 307/465; 307/243; 307/468
[58] Field of Search ............................... 307/465–469, 307/473, 480, 243; 364/716

[56] References Cited

U.S. PATENT DOCUMENTS

| | | | |
|---|---|---|---|
| 4,617,479 | 10/1986 | Hartmann et al. | 307/468 X |
| 4,675,556 | 6/1987 | Bazes | 364/716 X |
| 4,684,830 | 8/1987 | Tsui et al. | 307/465 |
| 4,758,746 | 7/1988 | Birkner et al. | 307/468 X |
| 4,758,747 | 7/1988 | Young et al. | 307/243 X |
| 4,763,020 | 8/1988 | Takata et al. | 364/716 X |
| 4,771,285 | 9/1988 | Agrawal et al. | 307/465 X |
| 4,783,606 | 11/1988 | Goetting | 307/468 X |
| 4,786,829 | 11/1988 | Letcher | 307/480 X |
| 4,789,951 | 12/1988 | Birkner et al. | 307/465 X |
| 4,835,414 | 5/1989 | Freidin | 307/243 |

OTHER PUBLICATIONS

Davis, "Enhanced State Sequencer for Sequential Logic Array", *IBM T. D. B.*, vol. 26, No. 1, 6-1983, pp. 99–104.

Davis, "Sequential Logic Array", *IBM T. D. B.*, vol. 23, No. 3, 8-1980, pp. 911–913.

Brickman et al., "Programmable Logic Array Logic Enhancement", IBM T. D. B., vol. 19, No. 2, 7-1976, p. 583.

*Primary Examiner*—David Hudspeth
*Attorney, Agent, or Firm*—Blakely, Sokoloff, Taylor & Zafman

[57] ABSTRACT

An improved architecture for and a method of operating a high speed synchronous state machine is disclosed having a programmable logic array receiving inputs from dedicated input registers and having an input/output macrocell which includes two state registers and two input registers, and two transparent latches and two feedback multiplexers. The outputs from the input registers are multiplexed through an input multiplexer and the input registers may be clocked at different input clock rates than the state clock which clocks the state registers.

6 Claims, 4 Drawing Sheets

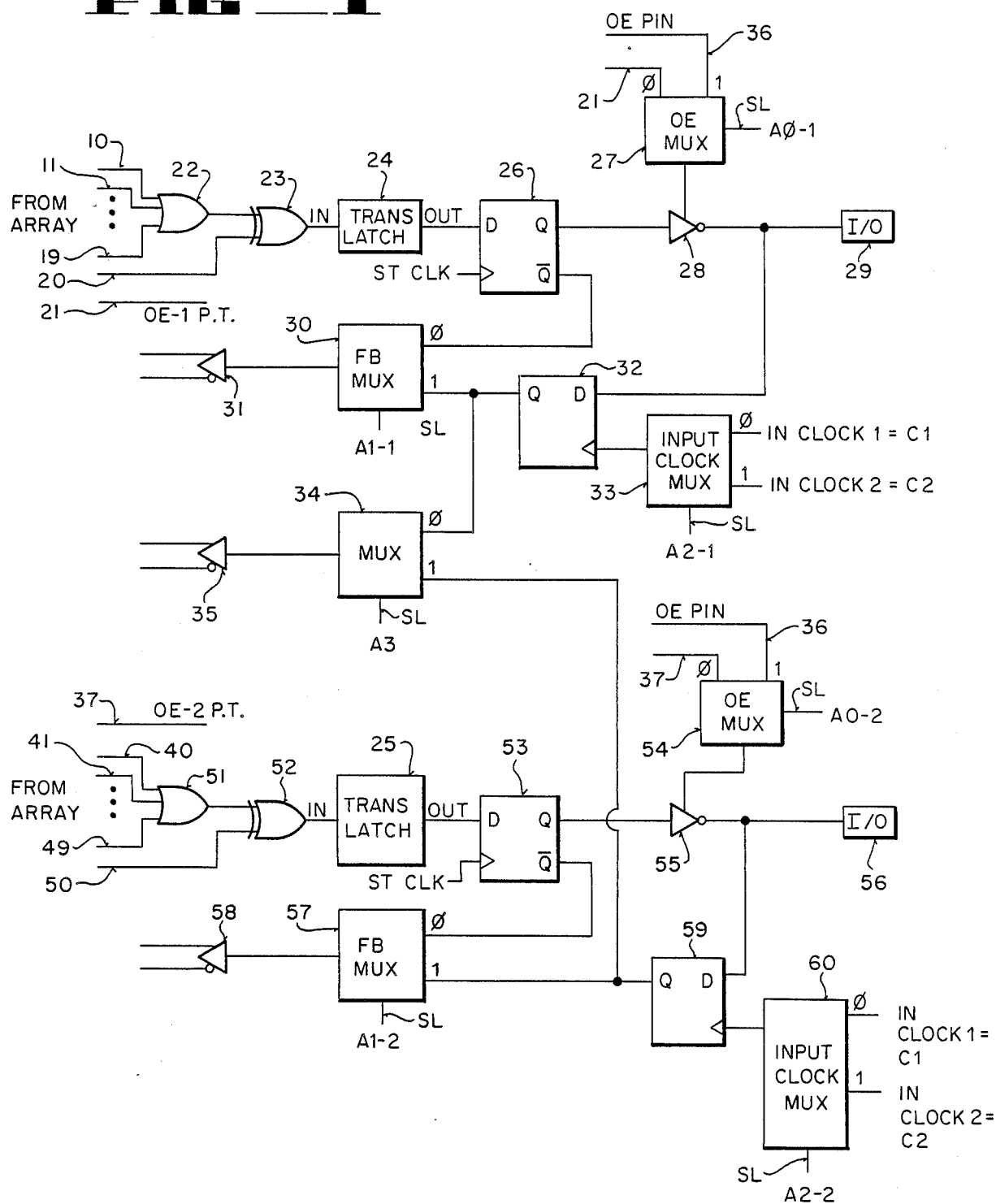
FIG_1

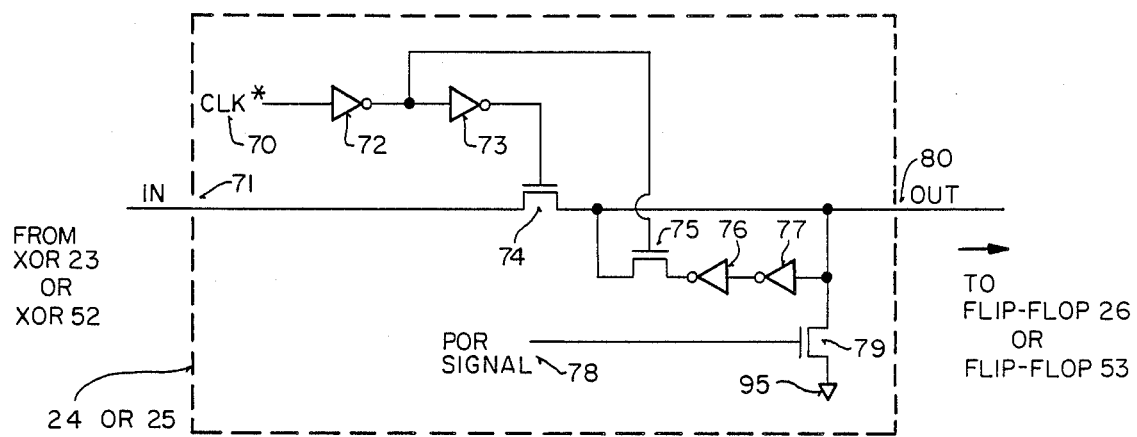
FIG_2
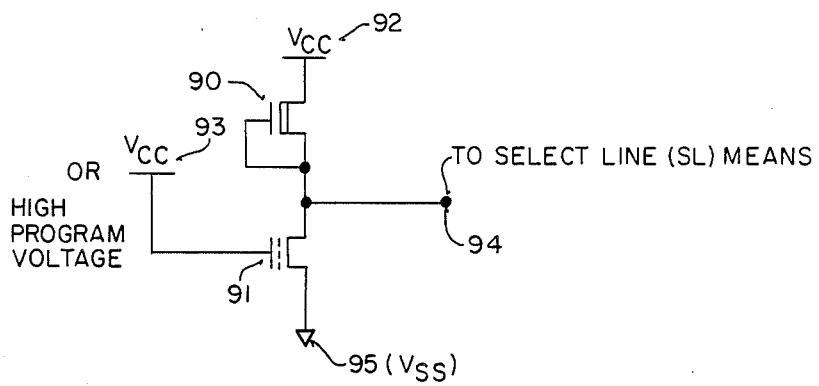
FIG_3
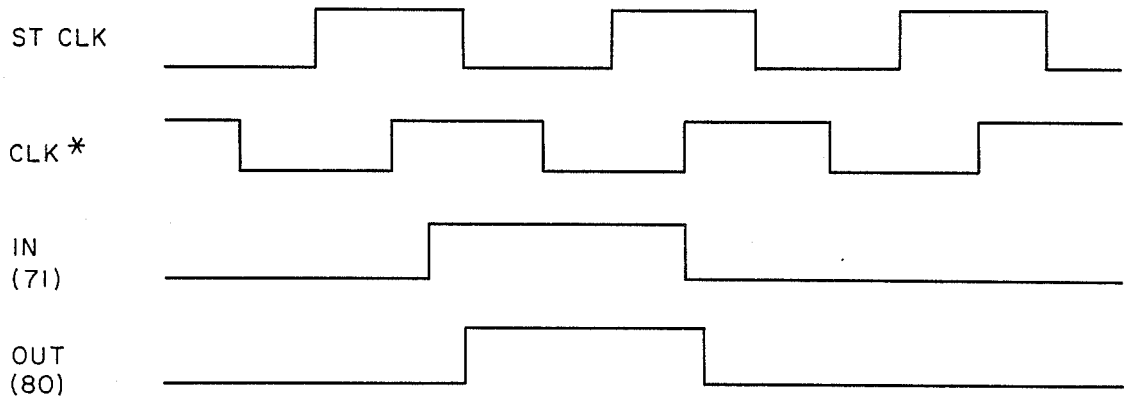
FIG_5

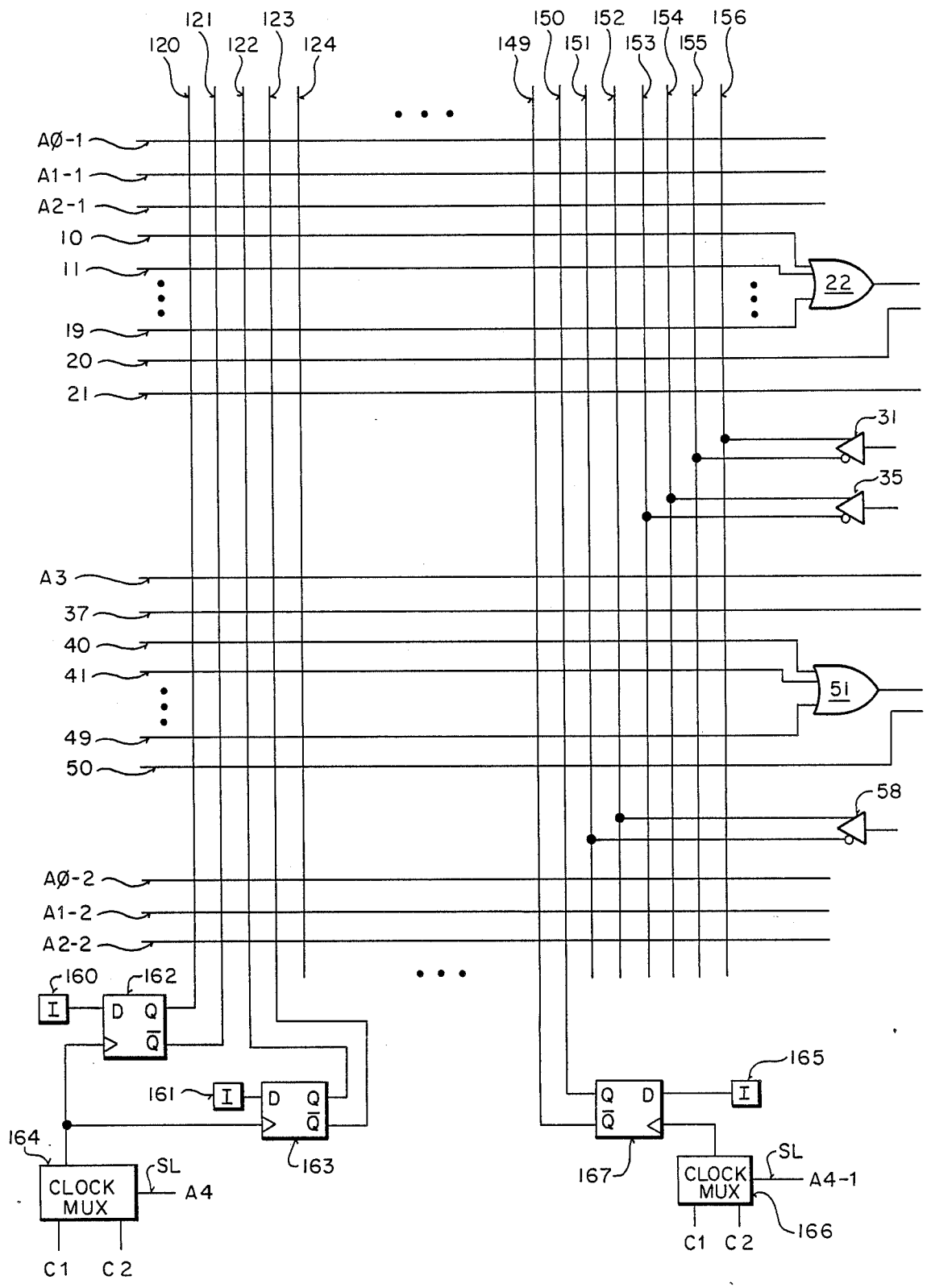
FIG_4

FIG_6
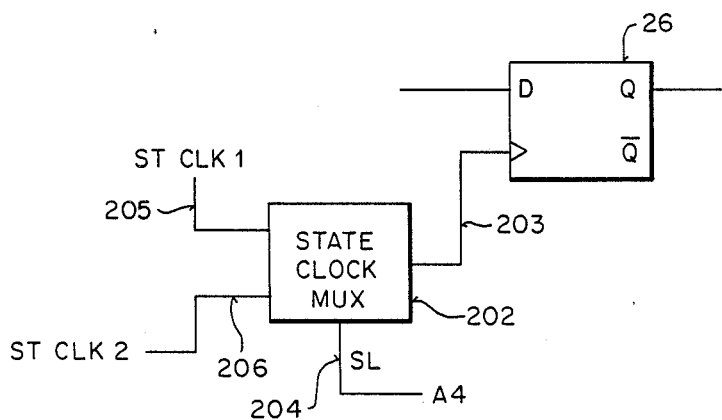
FIG_7A (PRIOR ART)
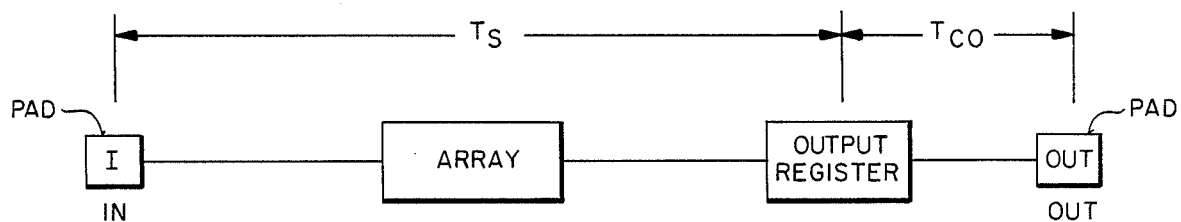
$$\text{FREQ}_{MAX} = \frac{1}{(T_S + T_{CO})}$$
FIG_7B
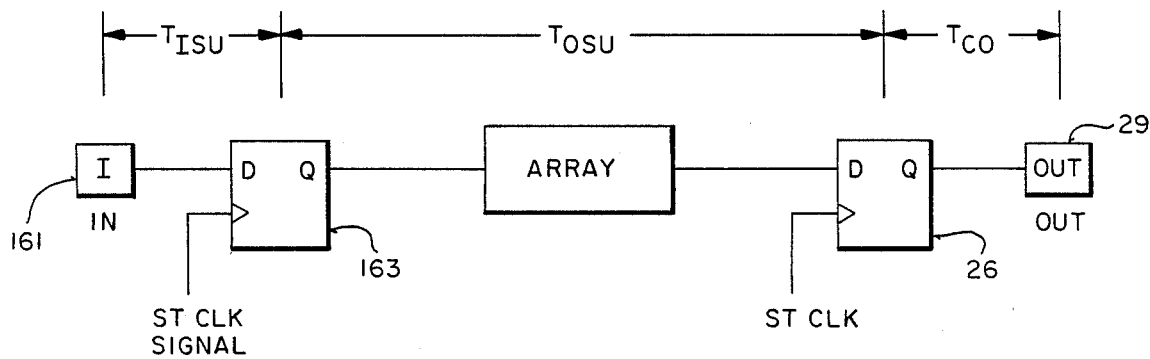
$$\text{FREQ}_{MAX} = \text{MINIMUM OF} \left[ \frac{1}{T_{OSU}} \text{ OR } \frac{1}{(T_{CO} + T_{ISU})} \right]$$

DUAL I/O MACROCELL FOR HIGH SPEED SYNCHRONOUS STATE MACHINE

BACKGROUND OF THE INVENTION

The present invention relates to the field of programmable logic devices, and particularly programmable logic devices which implement high speed synchronous state machines.

Typical prior art programmable logic devices (PLD) (which are sometimes also referred to as programmable logic arrays) have been used for asynchronour programmable logic. Examples of such programmable logic devices are well known in the art and are shown, for example, in U.S. Pat. Nos. 4,124,899; 4,609,986 and 4,617,479. The operation of these devices typically involves applying inputs to the input terms (typically shown as the vertical lines on a diagram illustrating the array), which input terms control the outputs of the various product terms (typically shown as the horizontal lines depicted in diagrams of the array). In a typical implementation of a programmable logic array using MOS (metal-oxide-semiconductor) field effect transistors, such as EPROMs (electrically programmable read only memory), a transistor or plurality of transistors is located at each intersection of a product term and input term in the array. Programming of a PLD proceeds in the well known manner as described in the prior art, such as the patents described above; also see an application assigned to the instant assignee filed Dec. 8, 1987, having Ser. No. 07/129,990.

Initial implementations of programmable logic devices often utilized registers, such as D flip-flops, at the outputs of the device. In these implementations, these registers were typically provided solely for outputting information from the array while there were inputs for the PLD which were dedicated solely to inputting information. Subsequent designs have included I/O pads (pins or connector means) which may be used for inputting or outputting because the pads are connected to programmable output cells which permit the pad to be used as an output or as an input. The user of these subsequent designs also has the option of not using the pad for inputting and feeding back the internal output from the array back to the array. The feedback to the array and the input from the I/O (input/output) pad is multiplexed through an input/feedback multiplexer (MUX). These programmabale outputs are now referred to programmable macrocells and do allow the user to control whether a pin is utilized for inputting or outputting. An example of these programmable macrocells are found incommercially available IC chips referred to as the 22V10.

These prior art designs often penalize users who wish to use the programmable logic array as a high speed synchronous state machine because a particular macrocell can not simultaneously allow inputting and outputting. Moreover, information available sooner than the next rising edge (or falling edge if so designed) of the state clock can not be input to the PLD but rather must wait until the next rising edge (or falling edge) of the state clock. These drawbacks make difficult the use of PLD's for high speed synchronous state machines. The present invention provides an architecture for a PLD, and particularly an architecture for a macrocell, such as a dual macrocell (having two I/O pads (connector means)) which permit the use of the PLD architecture as a high speed synchronous state machine.

SUMMARY OF THE INVENTION

The invention provides an architecture for a PLD and for a dual macrocell for a PLD which facilitates the use of the PLD as a high speed synchronous state machine. The invention includes a programmable logic device having input registers (e.g. D-type flip-flops) which are controlled by input clock signals which, in a preferred implementation, may be selected from two (input) clock signals. At least two outputs from the array are provided to each input/output dual macrocell. The input/output dual macrocell includes a first and a second input/output connector means (e.g. two pads, two pins, etc.). The dual macrocell also includes a first and a second state register; each of those state registers includes an input, an output and a complementary output and further includes a clock input. The clock inputs of the state registers are coupled to receive a state clock signal, which is typically the conventional state clock signal used for synchronous state machines, as is well known in the art.

The two state registers are coupled to the two outputs from the array through two transparent latches. Typically, each of the two outputs from the array for the dual macrocell are provided through an exclusive OR (XOR) gate which permits the optional inversion of the output from the array. The XOR gates also allow a designer to implement programmable flip-flops using well known programmable flip-flop architectures (to produce a T-type, R/S-type or J/k-type flip-flop). The dual macrocell further includes two tri-state latched output drivers each of which is coupled to receive the output from its respective state register, and each of which provides, under the control of an output enable signal, the output from the state registers to the respective connector means. The tri-state latched output drivers are controlled by two separate output enable multiplexers; the outputs of those multiplexers provide the output enable signal which enable each of the tri-state latched output drivers to provide the output to the connector means when the output enable signal is present. The two inputs to each of the output enable multiplexers are from a pin on the exterior of the PLD chip (allowing an external output enable signal to be provided by the user of the PLD chip) and from a product term in the PLD.

The macrocell of the invention further includes two feedback multiplexers. Each feedback multiplexer (MUX) has an output which is coupled to at least one input to the programmable array; typically, the output of the feedback MUX is coupled to a pair of complimentary input terms of the programmable array. Each feedback multiplexer includes two inputs (a first and a second input) which are selected between by a select line means which is coupled to receive a control signal from an architecture bit. For each feedback MUX, one of the inputs (the first input) to that MUX is coupled to the complementary output of one of the state registers. That is, the first input of the first feedback MUX is coupled to the complementary output of the first state register; similarly, the first input of the second feedback MUX is coupled to the complementary output of the second state register. The dual macrocell of the present invention further includes a first and a second input register, each of which has an input, an output and a clock input. The output from the first input register is coupled to the second input of the first feedback MUX, and the output from the second input register is coupled to the second input of the second feedback MUX. The clock input of the first input register is coupled to receive a first input clock signal through a first input clock multiplexer which selects between two clock signals which provide the input clock signals. Similarly, the clock input of the second input register is coupled to receive a second input clock signal through a second input clock multiplexer which is also coupled to receive the same clock signals which serve to provide the input clock signals. The two input clock multiplexers may be set differently such that one input register has an input clock signal that is faster than the input clock signal for the other input register. The dual macrocell of the present invention further includes an input multiplexer which is coupled between both input registers. That is, the input multiplexer has two inputs, one of which is coupled to the output of the first input register and the other of which is coupled to the output of the second input register. The input multiplexer is controlled by a select line means for selecting between the two outputs of the two input registers. The output of the input MUX is provided as an input to the programmable array. This input MUX allows the feeding back (to the array) of outputs from the state registers while also selecting one of the input registers as an input to the array. Moreover, the input registers, being clocked at a different clock rate than the state clock allow the input to be accepted faster (or slower) than the state clock and facilitate the faster operation of the state machine according to the present invention. Furthermore, the capability of clocking the input registers at two different clock rates (based on two different input clock signals) allows for the synchronization of two different circuit subsystems which operate on the two different clock rates.

The architecture of the PLD of the invention also includes dedicated input connector means (e.g. input pins) which are connected to the inputs of dedicated input registers (e.g. registers 162 and 163 in FIG. 4) to allow the clocking in of input signals. This architecture, when operated in a pipelined method, provides an increase in PLD performance (e.g. higher frequency of data output from the PLD). The pipelined method of operation is achieved when the dedicated input registers are controlled (clocked) by the state clock which also clocks the state registers. In the pipelined method of operation, the PLD of the invention will simultaneously operate on two sets of data in the following manner: a first data set will be clocked from the state register to the output (e.g. a connector means such as an output pin and/or pad) while the second data set will be clocked from the dedicated input register through the array to the state register. This method, which will be described below in more detail, allows the simultaneous processing through two delay paths and hence causes the overlapping of propagation delays through the PLD chip. By overlapping these delays, the maximum frequency of operation is increased relative to prior art PLDs.

DESCRIPTION OF THE DRAWINGS

FIG. 1 shows, by a logical gate level schematic, the architecture of the dual macrocell of the present invention.

FIG. 2 shows, by schematic representation, an implementation of the transparent latch of the present invention as utilized in the macrocell shown in FIG. 1.

FIG. 3 shows a preferred embodiment for the architecture bits provided to the select lines of the multiplexers utilized in the macrocell of the present invention.

FIg. 4 shows, by schematic representation, the array of the PLA of the present invention with the input registers which are dedicated solely to inputting information into the array.

FIG. 5 shows the relationship between the state clock and the "read clock" utilized by the transparent latch along with the inputs to and outputs from the transparent latch.

FIG. 6 shows an alternative state register having a state clock multiplexer which can select between a plurality (e.g. 2) of state clocks, thereby permitting a single PLD chip to have 2 separate state clocks which control 2 separate synchronous state machines on the same piece of silicon die (i.e. the same PLD chip).

FIG. 7A shows a conventional, prior art PLD and the maximum frequency of operation for that PLD.

FIG. 7B shows the PLD architecture of the present invention, where the input register and state (output) register are clocked with the same state clock to provide a pipelined method of operation, thereby producing a higher maximum frequency of operation for the PLD of FIG. 7B.

DETAILED DESCRIPTION OF THE INVENTION

The following detailed description of a preferred embodiment of the present invention will refer to various figures for purposes of illustration of a particular embodiment of the invention; upon reference to this description, those in the art will see that other implementations are possible. certain aspects of the invention which are well known and not necessary to an understanding of the invention will be described in block diagram form in order not to unnecessarily obscure the invention.

The improved architecture of the invention provides a high speed synchronous state machine using programmable logic devices, which contain arrays constructed from MOS field effect transistor ("MOSFET") technology. The PLD of the invention includes an input/output dual macrocell and the programmable array itself along with dedicated input registers which are dedicated to providing inputs to the array. Each input/output dual macrocell may also serve as two inputs to the array or as two outputs or as one input and one output. The I/O (input/output) macrocell of the invention includes two state registers, two input registers, two feedback multiplexers (FB MUX), an input multiplexer, two transparent latches, two input clock multiplexers and two output enable multiplexers (OE MUX), and two tri-state latched output drivers which are coupled to the two connector means (e.g. a pad, pin, etc). FIG. 1 illustrates an embodiment of the dual macrocell according to the present invention. As shown in FIG. 1, the product terms, such as product terms 10 through 19 and 40 through 49 are OR'd through OR gates 22 and 51 and then provided as inputs to the macrocell through exclusive OR gates 23 and 52 which provide optional inversion of the output from the array (i.e. optional inversion of the output from each OR gate). The general architecture of the programmable logic array will now be described with reference to FIG. 4.

FIG. 4 shows a programmabale logic array having a plurality of input terms (shown vertically in FIG. 4) which provide inputs to the array in the well known manner such as that described in the various patents referred to above. Thus, for example input terms 120 through 123 provide inputs to the array through the dedicated input registers 162 and 163 (which are shown as D-type flip-flops). Similarly, input terms 149 and 150 provide inputs to the array through the input register 167, the input of which is coupled to the pad 165, which is dedicated to an input pad. Input terms 151 through 156 receive their respective inputs through drivers 31, 35 and 58, each of which provides an output and a complementary (inverted) output. These drivers are also shown in FIG. 1.

FIG. 4 shows the conventional product terms, shown horizontally in the array, such as product terms 10-21 and product terms 40-50. Product terms 10, 11 . . . to 19 are OR'd by OR gate 22, and product terms 40, 41, 42 . . . to 49 are OR'd by OR gate 51. Product term 20 allows the optional inversion of the output from OR gate 22 via the exclusive OR gate 23. Similarly, product term 50 allows the optional inversion of the output from OR gate 51 via the exclusive OR gate 52. The output of the exclusive OR gate provides the output from the array to the dual macrocell, as shown in FIG. 1.

Programming and the construction and operation of the various cells which are at each intersection of a product term and an input term are well known in the art. For example, see the discussion in the co-pending application assigned to the instant Assignee filed Dec. 8, 1987, Ser. No. 07/129,990 (entitled FAST EPROM PROGRAMMABLE LOGIC ARRAY CELL). The array shown in FIG. 4 includes product terms which serve as "architecture bits" which provide inputs to the various select lines of the multiplexers in the macrocell shown in FIG. 1. It should be noted that it may be more preferable to provide programming for the architecture bits by the circuit shown in FIG. 3, which is described below in which case the product terms serving as architecture bits would not be used. As is well known in the art, a PLD chip is typically programmed by placing the chip in program mode during which time the various pads function as inputs to program the array or as inputs to program the various architecture bits.

During the normal operation ("run mode") of the PLA of the invention, inputs to the array are typically provided through various connector means, including input connector means 160, 161 and 165 which are dedicated solely to inputting of data into the array. The signals appearing on the input connector means are clocked into the input registers, such as input registers 162, 163 and 167 shown in FIG. 4. The signals from the input connector means are clocked into the input registers under the control of an input clock signal which is provided to the input registers by the clock MUXes 164 and 167. FIG. 4 shows a particular allocation of clock signals; that is, input registers 162 and 163 receive the same input clock signal while register 167 may receive a different input clock signal depending on whether clock signal C1 or clock signal C2 is selected as shown in FIG. 4. The inputs of each dedicated input register is coupled to its respective input connector means. The output and complementary output from each dedicated input register is coupled to a particular input term. The clock input of each input register shown in FIG. 4 is coupled to a clock MUX, such as clock MUX 164 or clock MUX 166. The select lines to the clock MUXes 164 and 166 select between the clock signals C1 and C2. Any one of these clock signals C1 and C2 may be the state clock signal which controls the state registers (as shown in FIG. 1), thereby providing the architecture shown in FIG. 7B in which a dedicated input register is clocked with the same state clock as the state register is clocked. The clock multiplexers 164 and 166 may be easily modified to provide for the multiplexing of "n" clock signals by a "n" input multiplexer. As shown in FIG. 4, the select line on clock MUX 164 receives a control signal (designated architecture bit A4) and the select line means on clock MUX 166 receives the control signal provided by the architecture bit A4-1.

The structure and operation of the input/output macrocell of the present invention will now be described with reference to FIG. 1. For each macrocell, the array provides two data outputs from the array through two OR gates, such as the OR gates 22 and 51. The outputs from the OR gates may be optionally inverted under the control of product terms 50 and 20 ("XOR product terms") which are coupled to one of the two inputs of the exclusive OR gates, such as exclusive OR gates 23 and 52. As is well known in the art, each XOR gate with its associated XOR product term also allows the user to implement a programmable flip-flop for the state register, which programmable flip-flop may be selectively programmed to be a T-type, R/S-type or J/K-type flip-flop rather than a D-type flip-flop. The output from each XOR is provided to the input of each transparent latch, as shown in FIG. 1. The transparent latch is used with a clocked sense amplifier referred to below. Thus, for example the output from the exclusive OR gate 23 is provided to the input of transparent latch 24. The output from the transparent latches is coupled to the input of the state registers. Hence, it can be seen that for the first state register in the macrocell shown in FIG. 1 (state register 26) the first output from the array is provided through the first transparent latch 24. Similarly, the input of the second state register 53 is coupled to the output provided by XOR gate 52 through the transparent latch 25. The clock input of both state registers 26 and 53 is coupled to the state clock, which is the conventional state clock signal provided by the user for a synchronous state machine. Each state register includes an input (the D input) an output (the Q output) and a complementary output ($\overline{Q}$).

FIG. 6 shows, by way of example, an alternative embodiment for the state registers used in the invention. Each state register or only some state registers have associated therewith a state clock multiplexer, such as multiplexer 202 shown in FIG. 6, which can select between a plurality (for example 2) of state clocks. As shown in FIG. 6, the clock input of state register 26 is coupled to the output 203 of the multiplexer 202. The remainder of the elements of state register 26 are connected as shown in FIG. 1. The select line means 204 is coupled to receive a control signal from an architecture bit which selects between the two inputs 205 and 206 of the multiplexer 202. The two inputs 205 and 206 are coupled to two different state clock signals, shown as st clk1 and st clk2. Typically, a plurality of alternative state registers as shown in FIG. 6 each with a state clock multiplexer will be included on a PLD chip. The select line means 204 for each state clock multiplexer will typically be coupled to a separate architecture bit to receive a control signal which is independent of the control signals for other state registers. Thus, two different state registers on the same PLD chip (which will typically be on a single, monolithic silicon die) may be controlled by two different state clocks. Thus, a single PLD chip can have two separate synchronous state machines on the same PLD chip.

Each macrocell according to the present invention includes two input/output connector means, such as conventional pads or pins found on modern integrated circuit (IC) chips. A connector means 29 and 56 are shown coupled to the output of two tri-state latched output drivers 28 and 55. As shown in FIG. 1, the output from state register 26 is coupled to the input of the tri-state latched output driver 28 and the output from the state register 53 is coupled to the input of the tri-state latched output driver 55. The output from these latched output drivers is controlled by the output enable signal which appears at the output of the OE MUX 27 and 54. For each OE MUX, the output of that MUX is coupled to a control input of the respective tri-state latched output driver. When the output enable signal is active the tri-state latched output driver provides the signal at the input of that driver to the output of the driver and therefore to the connector means coupled to the driver. When the output enable signal is disabled (not active) then the output of the driver appears as an open circuit (high resistance), thereby permitting the connector means coupled thereto to act as an input if necessary. The output enable signal originates from the two inputs to each OE MUX which inputs are selected between by the select lines means of each OE MUX. The select line means of OE MUX 27 is coupled to receive the signal provided by architecture bit A0-1, and the select line means for OE MUX 54 is coupled to receive the signal from the architecture bit A0-2. For each OE MUX, one input thereto is a product term from the array (e.g. product term 21 is an input to OE MUX 27) and the other input is from the output enable pin (OE pin) 36 which is typically provided on the exterior of the IC chip which incorporates the PLD.

Each I/O dual macrocell includes two feedback multiplexers (FB MUX) each of which has one output and two inputs which are selected between by a select line means. The outputs from the feedback MUX are provided as inputs to the programmable array; as shown in FIG. 1, the feedback MUXes 30 and 57 provide inputs to the array through the drivers 31 and 58 respectively. For each feedback MUX, one input is coupled to the complementary output of the state register associated with that feedback MUX and the other input is coupled to the output of the input register associated with that feedback MUX. For example, feedback MUX 30 is associated with state register 26 and input register 32. As shown in FIG. 1, one input of FB MUX 30 is coupled to the complementary output of state register 26 and the other input of FB MUX 30 is coupled to the output of input register 32. Select line means for the FB MUX 30 is coupled to receive the signal from architecture bit A1-1 which selects between the two inputs to the FB MUX 30. Similarly, the two inputs of the FB MUX 57 are selected between by the select line means of that multiplexer which receives the architecture bit signal A1-2. One input of the FB MUX 57 is coupled to the complementary output of the state register 53, and the other input of the FB MUX 57 is coupled to receive the output (Q) of the input register 59. The output (and the complementary output) of the FB MUX 57 is provided back to the array via the driver 58 as shown in FIG. 1.

As shown in FIG. 1, each dual I/O macrocell includes two input registers, shown as registers 32 and 59. Each input register includes an input, an output and a clock input. The clock input of each input register receives an input clock signal generated through an input clock MUX which is coupled to the respective input register. For example, as shown in FIG. 1, the clock input of input register 32 is coupled to the input clock MUX 33 to receive an input clock signal, which may be different than the input clock signal which is provided to the clock input of the input register 59 via input clock MUX 60. The input of each input register is coupled to the respective connector means and the output of each input register is coupled to an input of the respective FB MUX. Thus, as shown in FIG. 1, the input of input register 32 is coupled to the connector means 29, and the output of the input register 32 is coupled to an input to FB MUX 30. Similarly, the input (D) of input register 59 is coupled to the connector means 56 and the output of that register is coupled to an input of FB MUX 57. The input clock multiplexers 33 and 60 each include a select line means, an output and two inputs. For example, the input clock MUX 33 has a first and a second input for receiving a first and a second clock signal (in clock C1 and in clock C2). As shown in FIG. 1, in a typical implementation of the present invention, the first clock signal (in clock 1) is the same as the input clock C1 shown with respect to FIG. 4, and the second clock signal (in clock 2) is the same as the clock signal designated "C2" as shown in FIG. 4. The select line means of the input clock means 33 is coupled to receive the signal from architecture bit A2-1 which provides selection between the two in clock signals used to control inputting of data. The clock signal which is selected by the input clock MUX becomes the input clock signal which controls the inputting of data through the input registers 32 and 59.

The dual macrocell of the present invention also includes an input multiplexer (input MUX) which has an output which is coupled to an input of the programmable array. That output from the input MUX 34 is coupled to the array via driver 35 which provides the output from the input MUX 34 as well as the complementary output from that input MUX 34. The input MUX 34 has two inputs which are selected between by a select line means which is coupled to receive the architecture bit signal A3. One input of the input MUX 34 is coupled to the output of one of the input registers and the other input of the input MUX 34 is coupled to the output of the other input register. As shown in FIG. 1, the input labelled "0" of the input MUX 34 is coupled to the output of the input register 32 and the input labelled "1" is coupled to the output of the input register 59. As shown in FIG. 1, the input MUX 34 provides extra flexibility in the PLD of the present invention. Moveover, the input MUX 34 together with the transparent latches 24 and 25 permits the accelerated use of the PLD of the present invention to provide a higher speed synchronous state machine. If one of the state registers is not needed as an output to the connector means coupled to the state register, the output from the state register can be fed back (via the FB MUX 30 or FB MUX 57, depending on the particular state register). Thus, for example, if the output from state register 26 is not needed as an output *outside* of the chip, then the output of the state register 26 may be fed back to the array via the FB MUX 30. The feeding back of this output does not however, prevent the use of the connector means 29 as an input because that connector means can now be used as an input to the array via input register 32 and the input MUX 34. That is, an input can be clocked through connector means 29 into the input register 32 and then clocked to the Q output of input register 32 and through input MUX 34 (which is selected to cause the "0" input to be applied to the output of the input MUX 34). A separate input clock, which may be operated faster than the state clock, provides for acceptance of input signals which are clocked at a faster rate than the state clock because the input signal may be clocked in while the state clock is still in a single period and the output from the array will not be corrupted due to the master/slave nature of the state register (shown as a D-type flip-flop). Thus, the separate input clock allows the PLD of the invention to synchronize two or more clocked systems which operate at different clock rates.

FIG. 2 will now be referred to along with FIG. 5 to describe the structure and operation of the transparent latch, two of which are shown in FIG. 1 as transparent latches 24 and 25. The circuit schematic of the transparent latch is shown within the dashed lines in FIG. 2. The input 71 into the transparent latch is provided from the XOR gates, such as XOR 23 or XOR 52. The output 80 on the transparent latch is provided to the state registers such as state register 26 or state register 53. The transparent latch includes a read clock signal (CLK*) 70 which is provided to the input of inverter 72. The read clock signal 70 is timed to provide for the transparent latch to be enabled (i.e. opened so that in=out) when the read clock signal is high, as shown in FIG. 5. The output of inverter 72 is coupled to the input of inverter 73 and to the gate of the MOS field effect transistor 75. The output from inverter 73 is provided to the gate of MOS field effect transistor 74 which includes a source and a drain (two electrodes). One of the source or drain is coupled to the input 71 to the transparent latch and the other of the source and drain of the MOS field effect transistor 74 is coupled to the output 80 of the transparent latch. The MOS field effect transistor 75 also includes two electrodes (a source and a drain); one of those electrodes is coupled to the output 80 of the transparent latch and the other electrode is coupled to the output of the inverter 76. The transparent latch also includes an inverter 77, the input of which is coupled to the output 80 of the transparent latch and the output of which is coupled to the input of inverter 76. The transparent latch, as shown in FIG. 2, also includes an MOS field effect transistor 79 which is used to initialize the transparent latch into a stable initial state following a power on (i.e. when the chip is initially turned on). The gate of MOS field effect transistor 79 is coupled to receive a POR signal 78 (power on reset) which may be generated by conventional, well known means. For example, the POR signal 78 may be generated by a single shot, rising edge pulse generator, the input of which is coupled to the power supply fo the PLA chip (e.g. Vcc); the output from that single shot, rising edge pulse generator is then applied to the gate of the MOSFET 79 since that output provides the POR signal 78. An example of such a single shot, rising edge pulse generator is shown in page 376 of *The Art of Electonics*, Horowitz & Hill. The source of the MOSFET 79 is coupled to the ground signal 95 (Vss) and the drain of MOSFET 79 is coupled to the output 80 of the transparent latch.

The read clock signal 70 (CLK*), which is provided to the transparent latch typically has a relationship with the state clock such as that shown in FIG. 5. In particular, the read clock signal 70 will go momentarily high during a portion of a particular period of the state clock. The read clock signal 70 may be generated by delay circuits and pulse generators, such as the apparatus described and shown in an application assigned to the instant assignee which was filed on Sept. 2, 1988 and is entitled "LOW POWER SENSE AMPLIFIER FOR PROGRAMMABLE LOGIC DEVICE" (hereinafter "Low Power Sense Amplifier Application"). For example, see FIG. 2 and accompanying description of that application which is hereby incorporated by reference. The state clock of the present invention is applied to Node A of FIG. 2 of the Low Power Sense Amplifier Application and the resulting clk* signal is produced at Node C of the circuit shown in that FIG. 2. In the preferred embodiment of the PLD of the present invention, a clk* signal is generated from the three clocks (i.e. state clock, C1 and C2) with the circuit shown in FIg. 5 of the Low Power Sense Amplifier Application ("LPSA Application"), where each clock signal (state clock, C1 and C2) has its own pulse generation circuit 102 shown in detail in FIG. 2 of the Low Power Sense Amplifier Application; that is, the state clock signal is coupled to clock C1 to provide that signal to Node A of the circuit 102A as shown in FIG. 5 of the LPSA Application, and the signal C1 is provided to Node A of the circuit 102B shown in FIG. 5 of the LPSA Application, and the signal C2 is provided to Node A of the circuit 102C of FIG. 5 of the LPSA Application. Node 163 in FIG. 5 of the LPSA Application provides the clk* signal. In the preferred embodiment, the transparent latch is activated by the rising edge of any of these clocks (i.e. state clock, C1 or C2). Referring again to the instant invention, FIG. 5 of the present iinvention assumes the clocks C1 and C2 are not active during the time shown in FIG. 5. The transparent latch is used with the clocked sense amplifier which is disclosed in the Low Power Sense Amplifier Application. When the read clock signal 70 is high the latch is enabled permitting the output of the latch to be equated to the input of the latch. When the read clock signal 70 is low the latch is disabled such that the latch maintains the last input value to the latch which was present at the input of the latch when the read clock signal 70 began to fall. FIG. 5 shows a typical input signal and a typical resulting output signal from the transparent latch.

The architecture bits which provide the architecture bit signals to the multiplexers shown in FIG. 1 will typically be provided by a circuit similar to that shown in FIG. 3. These circuits are generally welll known in the art and are active and stable during a normal operation of the PLA. The architecture bit circuit shown in FIG. 3 includes a depletion MOS field effect transistor 90 and a floating gate field effect device 91 which includes a floating gate (shown as a dashed line) in addition to a source and a drain. The source of the floating gate device 91 is coupled to a ground signal 95 and the drain of the floating gate 91 is coupled to the source of the depletion device 90. The drain of the depletion device 90 is coupled to the power supply signal Vcc 92 and the gate of depletion device 90 is coupled to the source of device 90 and to the output 94 of the architecture bit circuit as shown in FIG. 3. The gate of floating gate device 91 is connected to a connector 93 which is typically multiplexed to provide one signal during the normal operation (run mode) of the PLA and another signal during the programming mode of the PLA. During the run mode, connector 93 provides the power supply signal Vcc (e.g. 5V) to the gate of the floating gate device 91. During the programming mode the connector 93 may or may not provide the high programming voltage depending on whether the user desires to program the architecture bit (i.e. charge the floating gate). FIG. 4 shows an alternative method of generating the architecture bit signals directly from the array. That is, the architecture bit signals are provided as product terms, such as product terms A0-1, A1-1, A2-1, A0-2, A1-2 and A202. Of course, if the architecture bits are generated by product terms as shown in FIG. 4, it is possible to change the architecture bit during the operation (run mode) of the PLA and therefore provides extra flexibility; however, the user must be careful not to inadvertently change an architecture bit during the normal use of the PLA.

The architecture of the PLD of the invention includes dedicated input connectors (e.g. input pads, such as input pads 160, 161 and 165 shown in FIG. 4) which are connected to the inputs of the dedicated input registers (e.g. registers 162 and 163 in FIG. 4) to allow the clocking in of input signals. This architecture, when operated in a pipelined method, provides an increase in PLD performance in that a higher frequency of data output is available from the PLD when compared to conventional PLDs, such as that shown in FIG. 7A. The pipelined method of operation is achieved when the dedicated input registers are controlled (clocked) by the state clock which also clocks the state registers. FIG. 7B shows the PLD of the invention set up to provide the pipeline method of operation. The clock multiplexers, such as clock multiplexers 164 and 166 will select the clock input, such as C1, which is coupled to receive the state clock signal which is also provided to the state registers.

In the pipelined method of operation, the PLD of the invention will simultaneously operate on two sets of data in the following manner:

a first data set will be clocked from the state register to the output while a second data set will be clocked from the dedicated input register through the array to the state register. As will be described in more detail below, the propagation delay shown in FIG. 7B as $T_{osu}$ is overlapped with a combined propagation delay ($T_{isu} + T_{co}$). That is, signals are being propagated through the array (and hence will be delayed by the propagation delay $T_{osu}$) *while* at the same time signals are propagating from the output register to the output pin/pad and from the input pin/pad to the input register. The improved performance results from the fact that these operations occur simultaneously *and* proceed through shorter paths causing shorter propagation delays than the signal path in the prior art PLD, such as that shown in FIG. 7A.

In FIG. 7A, one clock signal is provided for each data output. the entire propagation time will be determined by the combination of propagation delay $T_s$ and propagation delay $T_{co}$. The maximum frequency achievable with the architecture shown in FIG. 7A will be dependent upon the combination of the propagation delays $T_s$ and $T_{co}$. In other words, the maximum frequency of operation is the reciprocal of the summation of the propagation delay time $T_s$ and time $T_{co}$. Propagation delay $T_s$ is determined by the time an input signal which is applied to the array produces a stable output signal from the array which is provided to the input of the output register shown in FIG. 7A. Propagation delay $T_{co}$ is the propagation delay time from the rising edge of the clock signal controlling the output register shown in FIG. 7a and the appearance of a stable output signal at the output pad shown in FIG. 7A.

FIG. 7B shows the PLD of the invention configured in a manner to provide the pipelined method of operation. Both the dedicated input register, such as the dedicated input register 163, and the state register, such as the state register 26, are clocked by the state clock signal. The state clock signal is coupled to one of the clock inputs C1 or C2 which is selected by the select line means of clock mux 164; thus, the output from the clock mux 164 is the state clock signal which is also applied to the clock input of the state register 26. It can be seen from FIG. 7B, that the dedicated input register 163 is coupled as shown in FIG. 4 to the array; moreover, the state register 26 is coupled to the array as shown in FIG. 1 (with certain components not shown in FIG. 7B in order not to unnecessarily obscure the present explanation).

The architectue of the PLD shown in FIG. 7B has two delay paths, each of which is shorter than the single delay path (from in pad to out pad) in the PLD shown in FIG. 7A. Specifically, the first delay path in the PLD of FIG. 7B is from the output of the input register to the input of the output register through the array; hence, it can be seen that the propagation delay of that delay path is $T_{osu}$. The other delay path can be seen by imagining a conductor coupling the input to the output; that delay path includes the path from the input pad 161 to the dedicated input register 163 and the path from the state register 26 to the output pad 29. Thus, this second delay path has a propagation delay time which is the combination of the propagation delays $T_{co}$ and $T_{isu}$. The PLD of the invention as shown in FIG. 7B effectively has two shorter paths and therefore the larger of those two paths will be the largest time delay. Hence, since these paths are operated simultaneously (since the state clock controls both paths) it will be appreciated that the limiting factor in the maximum frequency of operation will be the propagation time delay of the larger path. Therefore, the maximum frequency of operation of the PLD according to FIG. 7B is the minimum of either the reciprocal of $T_{osu}$ or the reciprocal of ($T_{co} + T_{isu}$). In the architecture shown in FIG. 7B, the larger path will be smaller than the single delay path of the architecture shown in FIG. 7A because the total delay from input pad to output pad in both architectures shown in FIGS. 7A and 7B will be approximately the same and each of the smaller paths in FIG. 7B is less than the total path in FIG. 7B. Typically, the two smaller paths in the preferred embodiment have equivalent delays and thus the maximum achievable frequency is twice that of the previous architectures.

Each state clock signal for the PLD shown in FIG. 7B will, after the initial data out signal, produce a data signal at the output pad 29. Since the maximum frequency of the PLD of FIG. 7B is faster than the maximum frequency of the PLD of FIG. 7A, the state clock for the PLD in FIG. 7B may be operated at a faster rate than the clock coupled to the output register of the PLD in FIG. 7A. Hence, the PLD of FIG. 7B will provide output data at a faster rate (and hence higher performance) than the prior art PLD of FIG. 7A.

The invention has been described with reference to various figures, circuits and architectures. Moreover, the invention has been described using MOS field effect transistor technology. It will be appreciated by those in the art, that the invention may be implemented by using other circuits and technology (e.g. bipolar) and that other embodiments may be implemented without departing from the spirit and scope of the following claims.

We claim:

1. An input/output macrocell for a programmable logic device, said macrocell being coupled to a state clock to receive a state clock signal to operate a programmable array as a synchronous state machine and being coupled to a first and a second output of said array, said input/output macrocell comprising:

a first and a second input/output connector means;

a first and a second state register, said first state register having an input, an output and a complementary output and having a clock input, said clock input being coupled to receive a state clock signal, said second state register having an input, an output and a complementary output and having a clock input being also coupled to receive said state clock signal, said input of said first state register being coupled to said first output of said array through a first transparent latch, said input of said second state register being coupled to said second output of said array through a second transparent latch;

a first and a second tri-state latched output driver, said first tri-state latched output driver having an input, an output and a control input for receiving a first output enable signal, said output of said first tri-state latched output driver being coupled to said first input/output connector means, said input of said first tri-state latched output driver being coupled to said output of said first state register to provide the signal present on said output of said first state register to said first connector means when said first output enable signal is active, said second tri-state latched output driver having an input, an output and a control input for receiving a second output enable signal, said output of said second tri-state latched output driver being coupled to said second input/output connector means, said input of said second tri-state latched output driver being coupled to said output of said second state register to provide the signal present on said output of said second state register to said second connector means when said second output enable signal is active;

a first and a second feedback multiplexer, said first feedback multiplexer having an output coupled to a first input to said programmable array and having a first and a second input which are selected between by a first select line means, said second feedback multiplexer having an output coupled to a second input to said programmable array and having a first and a second input which are selected between by a second select line means, said first input of said first feedback multiplexer being coupled to said complementary output of said first state register and said first input of said second feedback multiplexer being coupled to said complementary output of said second state register;

a first and a second input register, said first input register having an input and an output and a clock input, said clock input being coupled to receive a first input clock signal, said input of said first input register being coupled to said first connector means and said output of said first input register being coupled to said second input of said first feedback multiplexer, said second input register having an input, an output and a clock input, said clock input of said second input register being coupled to receive a second input clock signal, said input of said second input register being coupled to said second connector means and said output of said second input register being coupled to said second input of said second feedback multiplexer;

a first and a second input clock multiplexer, said first input clock multiplexer having a first and a second input for receiving a first and a second clock signal and having an output being coupled to said clock input of said first input register to provide said first input clock signal and having a third select line means for selecting between said first and said second clock signals, said second input clock multiplexer having a first and a second input for receiving said first and said second clock signals and having an output being coupled to said clock input for said second input register to provide said second input clock signal and having a fourth select line means for selecting between said first and said second clock signals;

an input multiplexer having an output being coupled to a third input to said programmable array, and having a first and a second input, said first input of said input multiplexer being coupled to said output of said first input register and said second input of said input multiplexer being coupled to said output of said second input register, said input multiplexer having a fifth select line means for selecting between said first input and said second input of said input multiplexer.

2. An input/output macrocell as in claim 1 further comprising a first and a second XOR gate each having a first and a second input and having an output, said output of said first XOR gate being coupled to an input of said first transparent latch, and said output of said second XOR gate being coupled to an input of said second transparent latch, said first input of said first XOR gate being coupled to a product term of said programmable array, a first input of said second XOR gate being coupled to another product term of said programmable array, said second input of said first XOR gate being coupled to an output of a first OR gate having inputs being coupled to a first plurality of product terms of said programmable array, and said second input of said second XOR gate being coupled ot the output of a second OR gate, having inputs coupled to a second plurality of product terms of said programmable array.

3. An input/output macrocell as in claim 1 wherein said first input clock signal is the same as said second input clock signal.

4. An input/output macrocell as in claim 1 wherein said first input clock signal is different than said second input clock signal.

5. An input/output macrocell as in claim 1 wherein said first state register receives said state clock signal which is selected from a first and a second state clock signals, and said second state register receives said state clock signal which is selected between said first and said second state clock signals, such that said first state register may be clocked by a different state clock signal than said second state register.

6. A programmable logic device having a programmable array, said programmable logic device receiving a state clock signal to operate the programmable array as a synchronous state machine, said programmable array having a first and a second output from said array, said programmable logic device comprising:

a first and a second input/output connector means;

a first and a second state register, said first state register having an input, an output and a complementary output and having a clock input, said clock input being coupled to receive a state clock signal, said second state register having an input, an output and a complementary output and having a clock input being also coupled to receive said state clock signal, said input of said first state register being coupled to said first output of said array through a first transparent latch, said input of said second state register being coupled to said second output of said array through a second transparent latch;

a first and a second tri-state latched output driver, said first tri-state latched output driver having an input, an output and a control input for receiving a first output enable signal, said output of said first tri-state latched output driver being coupled to said first input/output connector means, said input of said first tri-state latched output driver being coupled to said output of said first state register to provide the signal present on said output of said first state register to said first connector means when said first output enable signal is active, said second tri-state latched output driver having an input, an output and a control input for receiving a second output enable signal, said output of said second tri-state latched output driver being coupled to said second input/output connector means, said input of said second tri-state latched output driver being coupled to said output of said second state register to provide the signal present on said output of said second state register to said second connector means when said second output enable signal is active;

a first and a second feedback multiplexer, said first feedback multiplexer having an output coupled to a first input to said programmable array and having a first and a second input which are selected between by a first select line means, said second feedback multiplexer having an output coupled to a second input to said programmable array and having a first and a second input which are selected between by a second select line means, said first input of said first feedback multiplexer being coupled to said complementary output of said first state register and said first input of said second feedback multiplexer being coupled to said complementary output of said second state register;

a first and a second input register, said first input register having an input and an output and a clock input, said clock input being coupled to receive a first input clock signal, said input of said first input register being coupled to said first connector means and said output of said first input register being coupled to said second input of said first feedback multiplexer, said second input register having an input, an output and a clock input, said clock input of said second input register being coupled to receive a second input clock signal, said input of said second input register being coupled ot said second connector means and said output of said second input register being coupled to said second input of said second feedback multiplexer;

a first and a second input clock multiplexer, said first input clock multiplexer having a first and a second input for receiving a first and a second clock signal and having an output being coupled to said clock input of said first input register to provide said first input clock signal and having a third select line means for selecting between said first and said second clock signals, said second input clock multiplexer having a first and a second input for receiving said first and said second clock signals and having an output being coupled to said clock input for said second input register to provide said second input clock signal and having a fourth select line means for selecting between said first and said second clock signals;

an input multiplexer having an output being coupled to a third input to said programmable array, and having a first and a second input, said first input of said input multiplexer being coupled to said output of said first input register and said second input of said input multiplexer being coupled to said output of said second input register, said input multiplexer having a fifth select line means for selecting between said first input and said second input of said input multiplexer;

a dedicated input register being coupled to an input connector means for providing inputs to said array, said dedicated input register having an input coupled to an input connector means and having an output coupled to an input to said programmable array, said dedicated input register having a clock input, said clock input being coupled to receive said state clock signal.

* * * * *